(12) United States Patent
Zhu

(10) Patent No.: US 11,114,632 B2
(45) Date of Patent: Sep. 7, 2021

(54) DISPLAY PANELS AND METHODS FOR MANUFACTURING THE SAME

(71) Applicant: Kunshan Go-Visionox Opto-Electronics Co., Ltd., Kunshan (CN)

(72) Inventor: Kunpeng Zhu, Kunshan (CN)

(73) Assignee: Kunshan Go-Visionox Opto-Electronics Co., Ltd., Kunshan (CN)

(*) Notice: Subject to any disclaimer, the term of this patent is extended or adjusted under 35 U.S.C. 154(b) by 0 days.

(21) Appl. No.: 16/746,992

(22) Filed: Jan. 20, 2020

(65) Prior Publication Data
US 2020/0152895 A1    May 14, 2020

Related U.S. Application Data

(63) Continuation of application No. PCT/CN2019/081792, filed on Apr. 8, 2019.

(30) Foreign Application Priority Data

Jul. 18, 2018 (CN) .......................... 201810792346.8

(51) Int. Cl.
*H01L 51/00* (2006.01)
*H01L 25/18* (2006.01)
(Continued)

(52) U.S. Cl.
CPC .......... *H01L 51/0097* (2013.01); *H01L 25/18* (2013.01); *H01L 51/56* (2013.01); *H01L 27/3244* (2013.01); *H01L 2251/5338* (2013.01)

(58) Field of Classification Search
None
See application file for complete search history.

(56) References Cited

U.S. PATENT DOCUMENTS 10,209,546 B2    2/2019  Chen et al.
10,403,857 B2 *  9/2019  Maruyama ........... G02B 5/3016
(Continued)

FOREIGN PATENT DOCUMENTS

CN     105977400 A    9/2016
CN     106910823 A    6/2017
(Continued)

OTHER PUBLICATIONS

CN First Office Action with Search Report dated Jul. 25, 2019 in the corresponding CN application (application No. 201810792346.8).
(Continued)

*Primary Examiner* — J. E. Schoenholtz
(74) *Attorney, Agent, or Firm* — Kilpatrick Townsend & Stockton LLP

(57) ABSTRACT

The present disclosure relates to display panels and manufacturing methods thereof. The display panel includes a flexible screen including a display area and a non-display area. The non-display area includes a bending area and an extending area, two ends of the bending area are respectively connected to the display area and the extending area. The extending area and the display area are not coplanar. The display panel further includes an attaching layer having at least one flexible film layer formed on the display area of the flexible screen. The attaching layer extends beyond the display area and covers and supports the bending area and/or the extending area.

15 Claims, 2 Drawing Sheets

(51) Int. Cl.
*H01L 51/56* (2006.01)
*H01L 27/32* (2006.01)

(56) References Cited

U.S. PATENT DOCUMENTS

| | | | |
|---|---|---|---|
| 2015/0102296 A1 | 4/2015 | Kim et al. | |
| 2017/0131582 A1 | 5/2017 | Park et al. | |
| 2017/0294495 A1* | 10/2017 | Shyu | H01L 27/3276 |
| 2017/0373121 A1 | 12/2017 | Leng et al. | |
| 2018/0006275 A1* | 1/2018 | Maruyama | H01L 51/0097 |
| 2018/0248140 A1* | 8/2018 | Sano | B32B 27/281 |
| 2018/0337220 A1* | 11/2018 | Kim | H01L 27/3244 |
| 2019/0097178 A1* | 3/2019 | Cho | G02F 1/133305 |
| 2019/0143664 A1 | 5/2019 | Bi et al. | |
| 2019/0384111 A1* | 12/2019 | Lee | G02F 1/133528 |
| 2020/0098830 A1* | 3/2020 | Yang | H01L 51/5284 |
| 2020/0303490 A1* | 9/2020 | Tomioka | G09F 9/30 |
| 2020/0408978 A1* | 12/2020 | Mashima | G02F 1/133528 |

FOREIGN PATENT DOCUMENTS

| | | |
|---|---|---|
| CN | 107767775 A | 3/2018 |
| CN | 107908308 A | 4/2018 |
| CN | 108281387 A | 7/2018 |
| CN | 109065570 A | 12/2018 |
| CN | 208488924 U | 2/2019 |
| WO | 2019144452 A1 | 8/2019 |

OTHER PUBLICATIONS

CN Second Office Action dated Jan. 3, 2020 in the corresponding CN application (application No. 201810792346.8).

\* cited by examiner

DISPLAY PANELS AND METHODS FOR MANUFACTURING THE SAME

CROSS-REFERENCES TO RELATED APPLICATIONS

This application is a continuation application for International Application PCT/CN2019/081792, filed on Apr. 8, 2019, which claims priority to Chinese Patent Applications No. 2018107923468, entitled "DISPLAY PANELS AND DISPLAY DEVICES", filed on Jul. 18, 2018, and the contents of these applications are incorporated by reference herein for all purposes.

TECHNICAL FIELD

The present disclosure relates to the technical field of display.

BACKGROUND

With the development of information technology, display devices such as mobile phones have become an indispensable tool in people's life, and display devices with "full screen" have also become more and more users' preference.

SUMMARY

The present disclosure provides display panels and methods for manufacturing the same.

A display panel includes: a flexible screen including a display area and a non-display area; the non-display area includes a bending area and an extending area, two ends of the bending area are connected to the display area and the extending area, respectively, and the extending area and the display area are not coplanar; and an attaching layer includes at least one flexible film layer formed on the display area of the flexible screen, the attaching layer extending beyond the display area and covering and supporting the bending area.

Optionally, the extending area is parallel to the display area, and the attaching layer at least partially covers the extending area.

Optionally, the attaching layer extends beyond the bending area in a longitudinal direction a length greater than 0.5 mm to cover the extending area.

Optionally, the attaching layer completely covers the extending area.

Optionally, the attaching layer includes one or more of a polarizer layer, a barrier film, and a flexible cover plate.

Optionally, the polarizer layer has a thickness of substantially 0 to 0.15 mm.

Optionally, the bending area of the flexible display body has a thickness of substantially 0 to 2 mm in a direction perpendicular to the display area.

Optionally, the display panel further includes a driving unit located in the extending area of the flexible screen.

Optionally, the display panel further includes a support layer supporting the display area and/or the extending area of the flexible screen together with the attaching layer.

Optionally, the support layer includes a padding block having hardness and elasticity and located between the display area and the extending area.

Optionally, the padding block has a thickness of substantially 0.1 mm to 1 mm in a direction perpendicular to the display area.

Optionally, a surface of a side of the padding block adjacent to the bending area of the flexible screen matches a shape of a surface of a side of the bent bending area adjacent to the padding block.

Optionally, a material of the padding block is silica gel.

Optionally, the support layer further includes a first support film located on a side of the display area of the flexible screen adjacent to the extending area, and a second support film located on a side of the extending area of the flexible screen adjacent to the display area, the padding block being located between the first support film and the second support film.

Optionally, an edge of the first support film adjacent to the bending area coincides with a first bending position of the bent flexible screen, an edge of the second support film adjacent to the bending area coincides with a second bending position of the bent flexible screen, and the first bending position and the second bending position are located at the two ends of the bending area, respectively.

Optionally, the extending area is adhered to a side of the second support film adjacent to the extending area.

Optionally, both the first support film and the second support film are polyethylene terephthalate films.

Optionally, the first support film and the second support film have a thickness of substantially 0 to 0.2 mm.

The present disclosure provides a method for manufacturing a display panel, including:

providing a flexible screen, the flexible screen includes a display area and a non-display area;

providing an attaching layer to attach the flexible screen to the attaching layer, the attaching layer includes at least one flexible film layer formed on a display area of the flexible screen, the attaching layer extending beyond the display area and covering and supporting the non-display area;

folding the flexible screen, forming the non-display area of the flexible screen into a bending area and an extending area, two ends of the bending area are connected to the display area and the extending area, respectively, and the extending area and the display area are not coplanar; and fixing the extending area of the flexible screen to a rear side of the flexible screen via a support layer.

The details of one or more embodiments are set forth in the accompanying drawings and the description below. Other features, objects, and advantages of the invention will be apparent from the description and drawings, and from the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE INVENTION

At present, a full-screen display device in the field of display is only a display device with a high screen-body ratio. In order to realize a full-screen display effect of the flexible screen, the non-display area of the flexible screen is bent, that is, the non-display area of the flexible screen is bent, so that the non-display area of the flexible screen is located on the back of the flexible screen, so that the width of the frame of the flexible screen is reduced, and the screen-body ratio of the flexible screen is increased.

When the non-display area of the flexible screen is bent, the bending area of the flexible screen is likely to have stress concentration. Therefore, a protective layer is usually formed on the bending area of the flexible screen to alleviate the bending stress of the flexible screen.

The smaller the width setting of the bending area, the smaller the width of the corresponding protective layer, the higher the technological requirement of forming the protective layer. Also, the smaller the width of the protective layer, the smaller the binding force between the protective layer and the flexible screen, which makes the protective layer easy to fall off, thus it is difficult to ensure the stability of mass production.

The present disclosure is described in details in combination with the accompanying drawings and embodiments such that the purpose, technical solution and advantages of the present disclosure are more apparent. It should be understood that the particular embodiments are described for the purpose of comprehending the present disclosure more fully and completely.

Figure 1:
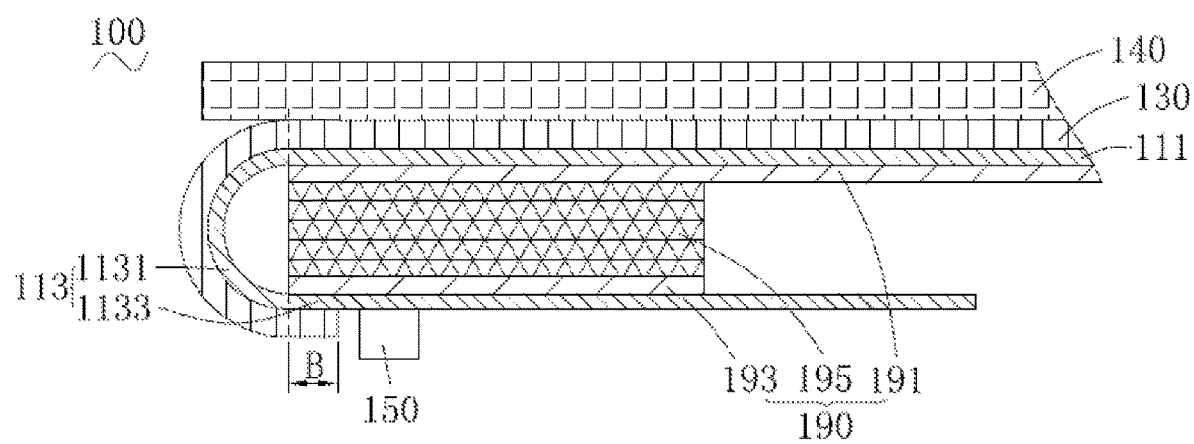
FIG. 1 is a cross-sectional view of a display panel according to an embodiment of the disclosure.
Figure 2:
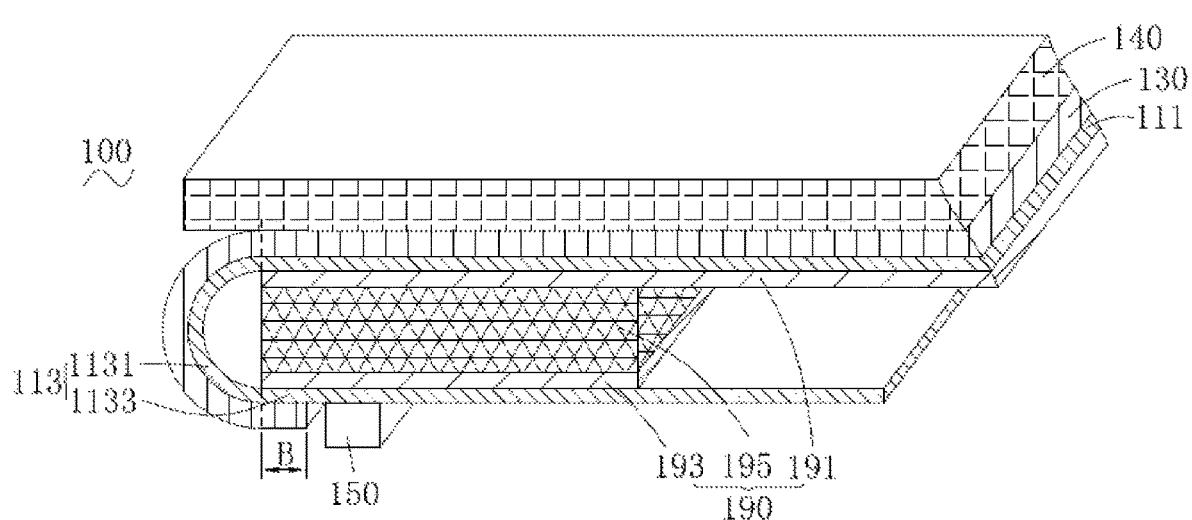
FIG. 2 is a partial, perspective view of a display panel according to an embodiment of the disclosure.

As shown in FIGS. 1 and 2, an embodiment of the disclosure provides a display panel 100. The display panel 100 includes a flexible screen and an attaching layer 130.

The flexible screen includes a display area 111 and a non-display area 113. The non-display area 113 includes a bending area 1131 and an extending area 1133. Two ends of the bending area 1131 are connected to the display area 111 and the extending area 1133 respectively. The extending area 1133 and the display area 111 are not coplanar. The extending area 1133 is parallel to the display area 111.

The flexible screen includes a flexible substrate including a first area (or display area) and a second area (or non-display area) extending from the first area.

A display layer can be integrated on the display area of the flexible substrate. The display layer includes a plurality of display parts for displaying an image, so that the display area of the flexible substrate forms a display area 111 of the flexible screen. The display layer includes display components such as thin film transistors, gate lines, data lines, capacitors, anodes, cathodes, organic light emitting layers, and color filters. A polarizer can also be provided on the display layer to increase the transmittance of the display layer and reduce reflection of external light. A flexible cover plate for protecting the flexible screen can be provided on the polarizer.

The second area of the flexible substrate is provided with an integrated circuit for implementing functions such as signal transmission and driving image display, thereby forming the non-display area 113 of the flexible screen. When the flexible screen is bent, only the non-display area 113 of the flexible screen is bent.

The metal trace in the bending area 1131 of the flexible screen usually forms circular or other shaped holes to alleviate the bending stress generated when the bending area 1131 of the flexible screen is bent. The metal trace in the bending area 1131 may also be configured as other forms on demand. The metal trace in the non-display area 113 of the flexible screen are of the same pattern. The direction of the metal trace in the bending area 1131 of the flexible screen may be a straight line or a curve.

The bent bending area 1131 is usually shaped as a hook. The bending angle of the bent bending area 1131 is 180 degrees, so that the extending area 1133 is parallel to the display area 111. Therefore, after bending the bending area 1131, the extending area 1133 of the flexible screen can be better supported and fixed, and the process is also facilitated. In addition, the space occupied by the flexible screen is effectively reduced.

The attaching layer 130 includes at least one flexible film layer formed on the display area of the flexible screen body. The attaching layer 130 extends beyond the display area 111 and covers and supports the bending area 1131.

The attaching layer 130 covers the bending area 1131, which means that the attaching layer 130 partially or completely covers the bending area 1131.

The attaching layer 130 extends beyond the bending area 1131 and covers and supports the extending area 1133. The attaching layer 130 covers the extending area 1133, which means that the attaching layer 130 partially or completely covers the extending area 1133.

The flexible film layer forming the attaching layer 130 may be a flexible film layer existing in the display panel 100, such as a flexible polarizer layer, a flexible cover plate, a flexible barrier film, or an additional flexible film layer formed on the flexible screen. Since the attaching layer 130 completely covers the display area 111 of the flexible screen, when the attaching layer 130 includes the additional flexible film layer, it is necessary to ensure that the additional flexible film layer does not affect the display of the display area 111 of the flexible screen.

As the flexible film forming the attaching layer 130 needs to be bent along with the bending of the flexible screen 1131, the flexible film forming the attaching layer 130 needs to be flexible.

In this embodiment, the attaching layer 130 is formed by forming at least one flexible film layer on the flexible screen. The attaching layer 130 can be bent along with the bending of the bending area 1131 of the flexible screen to alleviate the bending stress of the bending area 1131 of the flexible screen. As the attaching layer 130 covers the display area 111 and the bending area 1131 of the flexible screen, the fabrication process requirement of the attaching layer 130 is lower than that of the protective layer having a small width. In addition, the attaching layer 130 extends beyond the display area 111 and covers and supports the bending area 1131. Therefore, the adhesion force between the attaching layer 130 and the bending area 1131 is relatively large, and it is not easy to fall off, thereby effectively improving the stability of mass production.

In the embodiment, the attaching layer 130 includes a polarizer layer. For example, a display panel including the polarizer layer is selected, and the polarizer layer in the display panel is used as the attaching layer 130. The bending area 1131 of the flexible screen can be protected without adding the flexible film layer.

Usually there are many kinds of polarizers. In this embodiment, as the attaching layer 130, the polarizer needs to be able to be bent along with the bending area 1131 of the flexible screen. Therefore, when selecting the polarizer, a polarizer with soft material and small thickness should be selected. The thickness of the polarizer is substantially 0 to 0.15 mm.

When the polarizer is used as the attaching layer 130, the attaching layer 130 can not only alleviate the bending stress of the flexible screen 1131, but also can support the bending area 1131 of the flexible screen 1131, which makes the bending area 1131 of the flexible screen 1131 more difficult to be deformed and damaged to a certain extent. Therefore, additional support layer may not be needed for the flexible screen 1131.

The attaching layer 130 is not limited to the polarizer, a barrier film, flexible cover plate, or other flexible film layer in the display panel may be selected as the attaching layer 130, or at least two of the polarizer, the barrier film, the flexible cover plate, and other flexible film layer may be selected as the attaching layer 130.

When the attaching layer includes not only polarizer, or the attaching layer is formed by other flexible films other than polarizer, if the attaching layer has a certain flexibility, the attaching layer can still play a role of supporting the bending area 1131 of the flexible screen.

In the embodiment, the bending area 1311 of the flexible display body has a thickness of substantially 0 to 2 mm in a direction perpendicular to the display area 111.

In an embodiment, the display panel 100 further includes a driving circuit 150 located in the extending area 1133 of the flexible screen. The driving circuit 150 is located on the surface of the display area 111 away from the flexible screen of the extending area 1133. In the embodiment, the flexible screen is encapsulated with COP (Chip On Pi, chip on film) technology. According to design requirements, in other embodiments, the driving circuit 150 may not be located on the extending area 1133 of the flexible screen.

Optionally, a flexible circuit board may also be provided on the extending area 1133 of the flexible screen.

Optionally, the display panel 100 further includes a support layer 190. The support layer 190 and the attaching layer 130 cooperatively support the display area 111 and/or the extending area 1133 of the flexible screen.

The flexible film layer of the attaching layer 130 extends beyond the bending area 1131 and partially covers the extending area 1133 of the flexible screen, thereby better alleviating the bending stress at a bending line in the end of the bending area 1131 of the flexible screen.

The attaching layer 130 extends beyond the bending area 1131 in a length direction a length of greater than 0.5 mm to cover the extending area 1133, in other words, the distance B between the side of the attaching layer 130 adjacent to the extending area 1133 and the side of the bending area 1131 adjacent to the extending area 1133 is greater than 0.5 mm.

Optionally, the attaching layer 130 may also completely cover the extending area 1133 of the flexible screen, which can be easier to be implemented in processing.

The support layer 190 is mainly used to fix and support the flexible screen to prevent the bending area 1131 of the flexible screen from being broken due to excessive bending. The support layer 190 may include a multi-layer structure. Further, the support layer 190 may be of a material having both hardness and elasticity. The support layer 190 can not only support the flexible screen, but also reduce the vibration of the flexible screen. The support layer 190 includes a padding block 195 located between the display area 111 and the extending area 1133.

The support layer 190 further includes a first support film 191 located on a side of the display area 111 of the flexible screen adjacent to the extending area 1133, and a second support film 193 located on a side of the extending area 1133 of the flexible screen adjacent to the display area 111. The padding block 195 is located between the first support film 191 and the second support film 193.

In order to avoid the first support film 191 and the second support film 193 from affecting the bending of the bending area 1131 of the flexible screen, both of the first support film 191 and the second support film 193 should be offset from the bending area 1131 before and after bending of the bending area 1131.

In order to better support the display area 111 of the flexible screen, the edge of the first support film 191 adjacent to the bending area 1131 may coincide with the first bending position of the bent flexible screen. Similarly, in order to better support the extending area 1133 of the flexible screen, the edge of the second support film 193 adjacent to the bending area 1131 may coincide with the second bending position of the bent flexible screen. The first bending position and the second bending position are located at the two ends of the bending area 1131, respectively.

Both of the first support film 191 and the second support film 193 are PET (Polyethylene Terephthalate) films with supporting effects. The thickness of the first support film 191 and the second support film 193 could be designed into substantially 0 to 0.2 mm.

The extending area 1133 may be fixed on the second support film 193 by adhesive or physical methods.

The padding block 195 usually has a thickness of substantially 0.1 mm to 1 mm in the direction perpendicular to the display area 111. The thickness of the padding block 195 may also be adjusted according to the width of the bending area 1131.

The padding block 195 may be of a material such as silicone. The padding block 195 can have certain elasticity and hardness. The padding block 195 has a certain hardness so as to avoid the flexible screen to be squeezed and deformed. The padding block 195 has certain elasticity so as to avoid damage to flexible screen due to local stress.

The padding block 195 is located to avoid the bending area 1131 of the flexible screen. The surface of a side of the padding block 195 adjacent to the bending area 1131 of the flexible screen body matches the shape of the surface of a side of the bending area 1131 adjacent to the padding block 195, so that the surface of the side of the bending area 1131 of the flexible screen body adjacent to the padding block 195 is in contact with the surface of the padding block 195. Therefore, the padding block 195 also has certain supporting effect on the bending area 1131 of the flexible screen, so that the bending area 1131 of the flexible screen are not easily deformed and damaged.

The distance between the display area 111 and the extending area 1133 may also be ensured by increasing the thicknesses of the first support film 191 and second support film 193, or adding other support structures.

The display panel 100 may further include a glass cover 140. The glass cover 140 is located on a side of the attaching layer 130 away from the flexible screen.

An embodiment of the disclosure further provides a display device, and the display device includes a display panel 100. The display device may further include other components such as a housing.

An embodiment of the present disclosure further provides a method for manufacturing a display panel, the method includes the following steps.

Providing a flexible screen, the flexible screen includes a display area 111 and a non-display area 113.

Providing an attaching layer 130 to attach the flexible screen to the attaching layer 130. The attaching layer 130 includes at least one flexible film layer formed on a display area 111 of the flexible screen. The attaching layer 130 extends beyond the display area 111 and covers and supports the non-display area 113.

Folding the flexible screen, forming the non-display area 113 of the flexible screen into a bending area 1131 and an extending area 1133. The two ends of the bending area 1131 are connected to the display area 111 and the extending area 1131, respectively, and the extending area 1131 and the display area 111 are not coplanar.

Fixing the extending area 1131 of the flexible screen to a rear side of the flexible screen via a support layer 190.

For example, during the manufacturing process of the display panel, the flexible screen is firstly bonded with an attaching layer (e.g., polarizer) by an OCA (Optically Clear Adhesive), and then a jaw region (i.e., non-display area) of the flexible screen is cut out by a laser chamfer, and then the flexible screen is folded to fix the jaw region of the flexible screen to the back of the flexible screen by the support layer 190.

According to the display panel prepared by the described manufacturing method, an attaching layer is formed by forming at least one flexible film layer on the flexible screen. The attaching layer can be bent along with the flexible screen body, so as to alleviate the bending stress of the bending area of the flexible screen body. Since the flexible film layer extends beyond the display area and covers and supports the bending area, the fabrication process requirement of the attaching layer is lower than that of the protective layer having a small width. In addition, the attaching layer extends beyond the display area and covers and supports the bending area, so that the adhesion force between the attaching layer and the flexible screen is relatively and it is not easy to fall off, thereby effectively improving the stability of mass production.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A display panel, comprising:
   a flexible screen comprising a display area and a non-display area, the non-display area comprising a bending area and an extending area, and the extending area and the display area being not coplanar;
   an attaching layer formed on the display area, the attaching layer extending beyond the display area and covering and supporting the bending area; and
   a support layer configured to support the display area and/or the extending area, the support layer being configured as a multi-layer structure, comprising:
      a first support film coupled to the display area; and
      a second support film coupled to the extending area by adhesive or physical methods,
      wherein the support layer comprises a padding block having hardness and elasticity and located between the display area and the extending area, wherein the padding block comprises silica gel.

2. The display panel according to claim 1, wherein the extending area is parallel to the display area, and the attaching layer at least partially covers the extending area.

3. The display panel according to claim 2, wherein the attaching layer extends beyond the bending area in a longitudinal direction a length greater than 0.5 mm to cover the extending area.

4. The display panel according to claim 2, wherein the attaching layer completely covers the extending area.

5. The display panel according to claim 1, wherein the bending area has a thickness of less than 2 mm and greater than 0 mm in a direction perpendicular to the display area.

6. The display panel according to claim 1, further comprising a driving circuit located in the extending area.

7. The display panel according to claim 1, wherein the padding block has a thickness of about 0.1 mm to 1 mm in a direction substantially perpendicular to the display area.

8. The display panel according to claim 1, wherein a surface of a side of the padding block adjacent to the bending area of the flexible screen matches a shape of a surface of a side of the bent bending area adjacent to the padding block.

9. The display panel according to claim 1, wherein the first support film is located on a side of the display area of the flexible screen adjacent to the extending area, the second support film is located on a side of the extending area of the flexible screen adjacent to the display area, and the padding block is located between the first support film and the second support film.

10. The display panel according to claim 9, wherein an edge of the first support film adjacent to the bending area coincides with a first bending position of the bent flexible screen, an edge of the second support film adjacent to the bending area coincides with a second bending position of the bent flexible screen, the first bending position and the second bending position being located at the two ends of the bending area, respectively.

11. The display panel according to claim 9, wherein the extending area is adhered to a side of the second support film adjacent to the extending area.

12. The display panel according to claim 9, wherein both the first support film and the second support film are polyethylene terephthalate films.

13. The display panel according to claim 9, wherein the first support film and the second support film have a thickness of less than 0.2 mm and greater than 0 mm.

14. A method for manufacturing a display panel, comprising:
   providing a flexible screen, the flexible screen comprising a display area and a non-display area;
   providing an attaching layer to attach the flexible screen to the attaching layer, the attaching layer comprising at least one flexible film layer formed on a display area of the flexible screen, the attaching layer extending beyond the display area and covering and supporting the non-display area;
   folding the flexible screen, forming the non-display area of the flexible screen into a bending area and an extending area, wherein two ends of the bending area are connected to the display area and the extending area, respectively, and the extending area and the display area are not coplanar; and
   fixing the extending area of the flexible screen to a rear side of the flexible screen via a support layer, wherein the support layer being coupled to the display area and/or the extending area.

15. A display panel, comprising:
- a flexible screen comprising a display area and a non-display area, the non-display area comprising a bending area and an extending area, and the extending area and the display area being not coplanar;
- an attaching layer formed on the display area, the attaching layer extending beyond the display area and covering and supporting the bending area; and
- a support layer configured to support the display area and/or the extending area, the support layer being coupled to the display area and/or the extending area, comprising:
  - a padding block having hardness and elasticity and located between the display area and the extending area, the padding block comprising silica gel.

* * * * *